(12) United States Patent
Chen

(10) Patent No.: US 10,831,240 B2
(45) Date of Patent: Nov. 10, 2020

(54) POWER LINE WIRING STRUCTURE AND FLEXIBLE DISPLAY PANEL HAVING SAME

(71) Applicant: WUHAN CHINA STAR OPTOELECTRONICS SEMICONDUCTOR DISPLAY TECHNOLOGY CO., LTD., Wuhan (CN)

(72) Inventor: Tao Chen, Wuhan (CN)

(73) Assignee: Wuhan China Star Optoelectronics Semiconductor Display Technology Co., Ltd., Hubei (CN)

(*) Notice: Subject to any disclaimer, the term of this patent is extended or adjusted under 35 U.S.C. 154(b) by 5 days.

(21) Appl. No.: 16/472,289

(22) PCT Filed: Jan. 17, 2019

(86) PCT No.: PCT/CN2019/072249
§ 371 (c)(1),
(2) Date: Jun. 21, 2019

(87) PCT Pub. No.: WO2020/107686
PCT Pub. Date: Jun. 4, 2020

(65) Prior Publication Data
US 2020/0233463 A1    Jul. 23, 2020

(30) Foreign Application Priority Data

Nov. 26, 2018  (CN) .......................... 2018 1 1416954

(51) Int. Cl.
*G06F 1/16*      (2006.01)
*G09F 9/30*      (2006.01)

(52) U.S. Cl.
CPC ............ *G06F 1/1652* (2013.01); *G09F 9/301* (2013.01)

(58) Field of Classification Search
CPC ................................................... G06F 1/1652
See application file for complete search history.

(56) References Cited

U.S. PATENT DOCUMENTS

| | | | |
|---|---|---|---|
| 2009/0189835 A1* | 7/2009 | Kim | G09G 3/3677 345/80 |
| 2018/0067356 A1* | 3/2018 | Katsuta | H01L 27/3297 |

\* cited by examiner

*Primary Examiner* — Jerry Wu
(74) *Attorney, Agent, or Firm* — Rosenberg, Klein & Lee

(57) ABSTRACT

A power line wiring structure and a flexible display panel having the same are provided. The power line wiring structure includes a first power line and a second power line. The first power line includes a first lateral section, a first connection section, and a second lateral section. The first connection section includes at least two first sub-connection lines. The second power line includes a retracted section, a second connection section, and a peripheral section. The second connection section includes at least two second sub-connection lines, and the at least two second sub-connection lines are respectively disposed outside the at least two first sub-connection lines. A width of the second sub-connection line is less than a width of the first sub-connection line.

1 Claim, 3 Drawing Sheets

POWER LINE WIRING STRUCTURE AND FLEXIBLE DISPLAY PANEL HAVING SAME

FIELD OF INVENTION

This disclosure relates to a power line wiring structure and flexible display panel thereof, and more particularly, to a power line wiring structure and flexible display panel thereof for improving brightness uniformity of the display panel.

BACKGROUND OF INVENTION

In design of active matrix organic light-emitting diode (AMOLED) display panels, improving brightness uniformity has always been a key issue in display panel design. An IR drop is the most important factor affecting the brightness uniformity of the display panel.

At present, a lower-border power line is adopted as a conventional design method, and high-potential power lines (VDD) and low-potential power lines (VSS) are usually entered into a display area (Active Area) from the same position. That causes a voltage difference between VDD and VSS near that position very large, so that operating current of a driver thin film transistor (driver TFT) is increased. The area becomes a region with the highest brightness, and brightness uniformity is greatly affected by the brightness of this area. In the conventional technology, although a double-metal layered source/drain layer or other external compensation method has been used to reduce the IR drop and improve the brightness uniformity, these methods increase the cost of products and reduce the yield of the mass production.

Therefore, it is necessary to provide a power line wiring structure and a flexible display panel thereof, which can improve the brightness uniformity of the display panel, to solve the drawbacks of conventional technology.

SUMMARY OF INVENTION

In the conventional technology, high-potential power lines (VDD) and low-potential power lines (VSS) are entered into a display area (Active Area) from the same position. That causes a voltage difference between VDD and VSS near that position very large, so that operating current of a driver thin film transistor (Driver TFT) is increased. The area becomes a region with the highest brightness, and brightness uniformity is greatly affected by the brightness of this area. In the conventional technology, although double-metal layered source/drain layer or other external compensation method has been used to reduce the IR drop and improve the brightness uniformity, these methods increase the cost of products and reduce the yield of the mass production.

The main object of this disclosure is to provide a power line wiring structure. A position for a first power line entering into a display area (i.e., AA area) is separated from a position for a second power line (i.e., VDD and VSS) entering into a display area. An appropriate spacing is disposed to avoid excessive VDD and VSS voltage differences. Brightness uniformity of a display panel is improved. At the same time, it can prevent the VDD voltage from being too concentrated on the lower side of the AA region, resulting in excessive current of a driver thin film transistor (Driver TFT). In addition, a wiring arrangement and a line width of the power line are optimized to reduce voltage drop and reduce power consumption.

Another object of this disclosure is to provide a flexible display panel which can improve the brightness uniformity of the display panel by using the above-described power line wiring structure.

In order to achieve the foregoing object of this disclosure, an embodiment of this disclosure provides a power line wiring structure for a flexible display panel. The power line wiring structure comprises a first power line comprising a first lateral section, a first connection section, and a second lateral section, wherein the first lateral section is connected to the second lateral section through the first connection section, and the first connection section comprises at least two first sub-connection lines; and a second power line comprising a retracted section, a second connection section, and a peripheral section, wherein the retracted section is connected to the peripheral section through the second connection section, the second connection section comprises at least two second sub-connection lines, and the at least two second sub-connection lines are respectively disposed outside the at least two first sub-connection lines; wherein a width of the second sub-connection line is less than a width of the first sub-connection line.

According to an embodiment of the disclosure, the flexible display panel comprises a display area and a non-display area, the non-display area is disposed around the display area, the non-display area comprises a bending area disposed at a first side of the display area, and wherein the first lateral section is disposed between the display area and the bending area.

According to an embodiment of the disclosure, the first connection section and the second connection section both pass through the bending area, and the bending area is disposed between the first lateral section and the second lateral section.

According to an embodiment of the disclosure, a distance between a center line of the first sub-connection line and a second side of the display area is in a range of 20 mm to 30 mm, and wherein the second side and the first side are adjacent to each other.

According to an embodiment of the disclosure, the width of the first sub-connection line is in a range of 2000 microns to 4000 microns.

According to an embodiment of the disclosure, a width of the second lateral section is in a range of 1000 microns to 3000 microns.

According to an embodiment of the disclosure, a distance between the second sub-connection line and the first sub-connection line is greater than the width of the first sub-connection line.

According to an embodiment of the disclosure, the width of the second sub-connection line is greater than or equal to 800 microns.

An embodiment of this disclosure further provides a power line wiring structure for a flexible display panel. The power line wiring structure comprises a first power line comprising a first lateral section, a first connection section, and a second lateral section, wherein the first lateral section is connected to the second lateral section through the first connection section, and the first connection section comprises at least two first sub-connection lines; and a second power line comprising a retracted section, a second connection section, and a peripheral section, wherein the retracted section is connected to the peripheral section through the second connection section, the second connection section comprises at least two second sub-connection lines, and the at least two second sub-connection lines are respectively disposed outside the at least two first sub-connection lines;

wherein the flexible display panel comprises a display area and a non-display area, the non-display area is disposed around the display area, the non-display area comprises a bending area disposed at a first side of the display area, and wherein the first lateral section is disposed between the display area and the bending area; and wherein a width of the second sub-connection line is less than a width of the first sub-connection line, and a distance between the second sub-connection line and the first sub-connection line is greater than the width of the first sub-connection line.

An embodiment of this disclosure further provides a flexible display panel. The flexible display panel comprises a display area and a non-display area, the non-display area comprises a power line wiring structure as mentioned above. In one embodiment of the disclosure, the non-display area is disposed around the display area, the non-display area comprises a bending area disposed at a first side of the display area, and wherein the first lateral section is disposed between the display area and the bending area.

According to an embodiment of the disclosure, the first connection section and the second connection section both pass through the bending area, and the bending area is disposed between the first lateral section and the second lateral section.

According to an embodiment of the disclosure, the display area comprises a second side, the second side and a first side of the display area are adjacent to each other.

According to an embodiment of the disclosure, a distance between a center line of the first sub-connection line and a second side of the display area is in a range of 20 mm to 30 mm, and wherein the second side and the first side are adjacent to each other.

According to an embodiment of the disclosure, the width of the first sub-connection line is in a range of 2000 microns to 4000 microns.

According to an embodiment of the disclosure, a width of the second lateral section is in a range of 1000 microns to 3000 microns.

According to an embodiment of the disclosure, a distance between the second sub-connection line and the first sub-connection line is greater than the width of the first sub-connection line.

Advantageous effects of the disclosure are as follows. The disclosure provides a power line wiring structure. A position for a first power line entering into a display area (i.e., AA area) is separated from a position for a second power line (i.e., VDD and VSS) entering into a display area. An appropriate spacing is disposed to avoid excessive VDD and VSS voltage differences. Brightness uniformity of a display panel is improved. At the same time, it can prevent the VDD voltage from being too concentrated on the lower side of the AA region, resulting in excessive current of a driver thin film transistor (Driver TFT). In addition, a wiring arrangement and a line width of the power line are optimized to reduce voltage drop and reduce power consumption.

Another advantageous effect of this disclosure is to provide a flexible display panel which can improve the brightness uniformity of the display panel by using the above-described power line wiring structure.

DETAILED DESCRIPTION OF PREFERRED EMBODIMENTS

Figure 1:
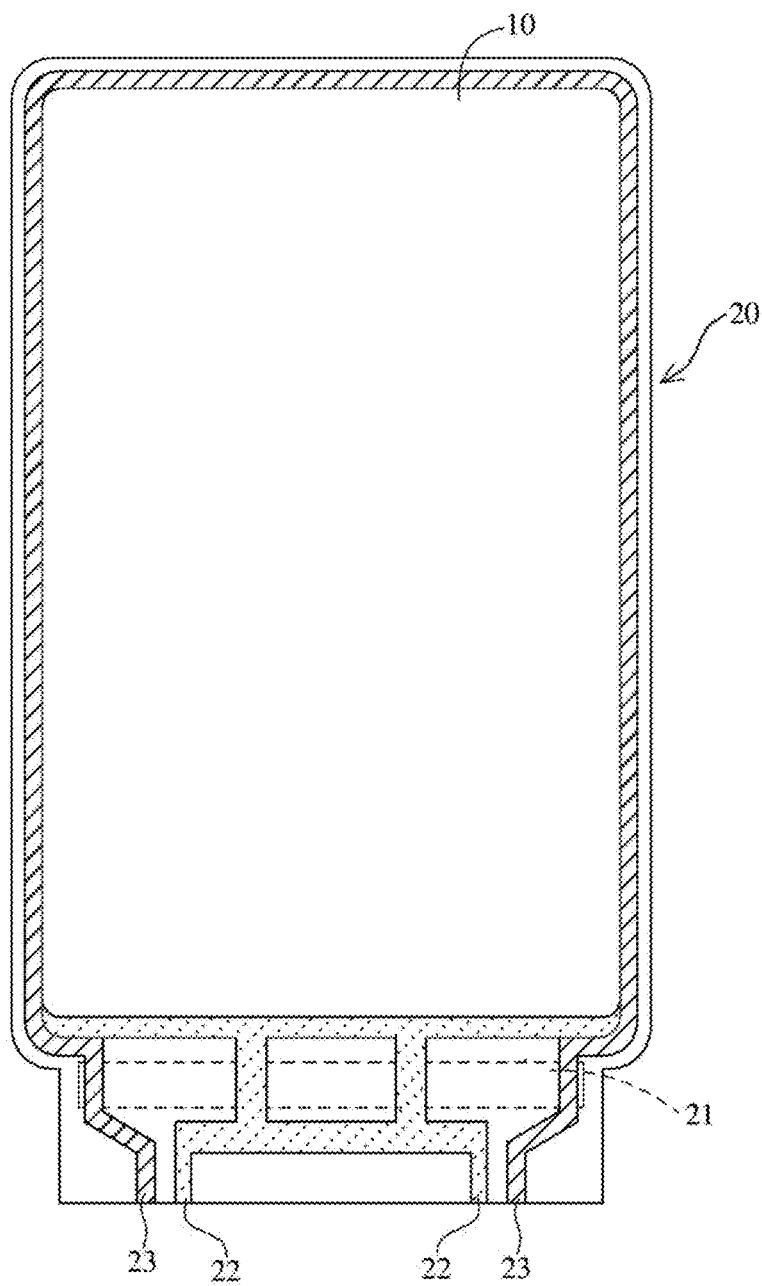
FIG. 1 is a schematic overall view of a flexible display panel according to an embodiment of the disclosure.

This description of the exemplary embodiments is intended to be read in connection with the accompanying drawings, which are to be considered part of the entire written description. In the description, terms such as "lower", "upper", "horizontal", "vertical", "above", "below", "up", "down", "top", and "bottom", as well as derivatives thereof, should be construed to refer to the orientation as then described or as shown in the drawing under discussion. These terms are for convenience of description and do not require that the apparatus be constructed or operated in a particular orientation, and do not limit the scope of the disclosure. Referring to the drawings of the disclosure, similar components are labeled with the same number.

Referring to FIG. 1, in which a schematic view of a flexible display panel according to an embodiment of the disclosure is shown. The flexible display panel comprises a display area 10 and a non-display area 20. The display area 10 is mainly used for displaying an image, and comprises an organic light emitting diode (OLED) layer, a source layer, a drain layer, and the like, but is not limited thereto. The non-display area 20 surrounds the display area 10 and comprises a bending area 21 disposed on a lower side of the display area 10. In an embodiment of the disclosure, the bending area 21 can be used to bend the flexible display panel to manufacture a display device (not shown), and the bending area 21 corresponds to a lower frame of the display device to realize a design of narrowed frame. Of course, it is not limited for the bending area 21 only being disposed at the lower frame of the display device. The bending area 21 can also be disposed on other frame portions of the display device, such as a left frame, a right frame, or an upper frame, according to design requirements.

The non-display area 20 also comprises a power line wiring structure. The power line wiring structure comprises a first power line 22 and a second power line 23.

Figure 2:
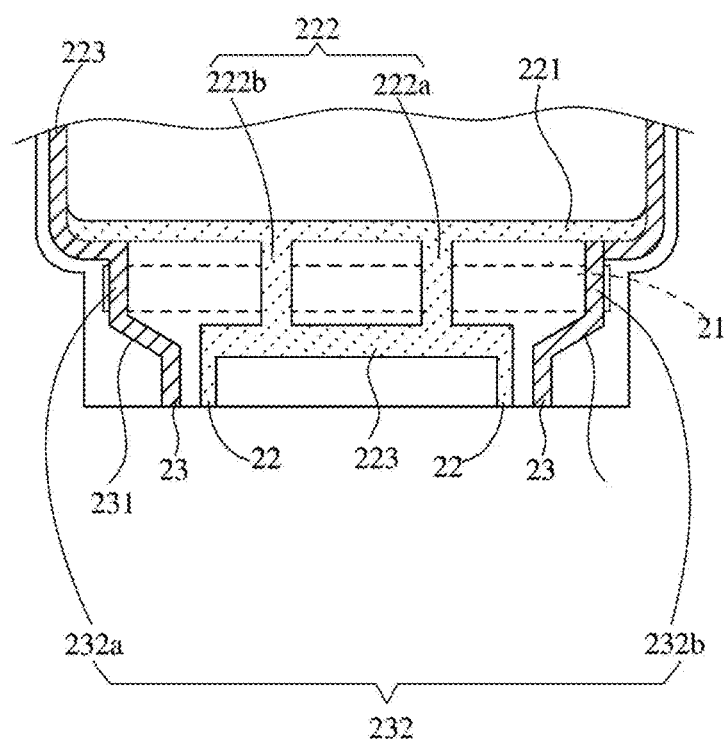
FIG. 2 is a partial schematic view of the flexible display panel of the disclosure.

Please refer to FIG. 2, the first power line 22 comprises a first lateral section 221, a first connection section 222, and a second lateral section 223.

The first lateral section 221 is connected to the second lateral section 223 through the first connection section 222, and the first connection section 222 comprises at least two first sub-connection lines, such as a sub-connection line 222a and a sub-connection line 222b. The second power line 23 comprises a retracted section 231, a second connection section 232, and a peripheral section 233.

The retracted section 231 is connected to the peripheral section 233 through the second connection section 232, the second connection section 232 comprises at least two second sub-connection lines, such as the sub-connection line 232a and the sub-connection line 232b. The sub-connection line 232a and the sub-connection line 232b extend upward as the peripheral section 233 and extend downward as the retracted section 231. The second sub-connection line 232 is disposed outside the first sub-connection line 22. That is, the sub-connection line 232a is disposed at the left side of the sub-connection line 222a, and the sub-connection line 232b is disposed at a right side of the sub-connection line 222b. Preferably, a width of the second sub-connection line is less than a width of the first sub-connection line. That is, a width of the sub-connection line 232a is less than the width of the sub-connection line 222a, and a width of the sub-connection line 232b is also less than a width of the sub-connection line 222b.

In an embodiment, the first lateral section 221 is disposed between the display area 10 and the bending area 21. The first connection section 222 and the second connection section 232 both across the bending area 21. In actual fabrication, it can be wired through source/drain layers or directly through vias from above or below the source/drain layers. The bending area 21 is disposed between the first lateral section 221 and the second lateral section 223. Thus, after bending, the distance between the second lateral section 223 and the first lateral section 221 will be reduced. The second lateral section 223 and the retracted section 231 can be disposed on an integrated circuit (not shown) at a lower edge of the flexible display panel and electrically connected to the integrated circuit.

In an embodiment, a distance between a center line of the sub-connection line 222a and a left side of the display area 10 is in a range of 20 mm to 30 mm, and a distance between the sub-connection line 222b and a right side of the display area 10 is in a range of 20 mm to 30 mm. Preferably, a width between the sub-connection line 222a and the sub-connection line 222b is in a range of 2000 microns to 4000 microns. Preferably, the width of the second lateral section 223 is in a range of 1000 microns to 3000 microns. In an embodiment, a distance between the sub-connection line 223a and the sub-connection line 222a is greater than a width of the sub-connection line 222a. A distance between the sub-connection line 222b and the sub-connection line 232b is greater than the width of the sub-connection line 222b. Preferably, the width of the sub-connection line 232a and the width of the sub-connection line 232b are both greater than or equal to 800 microns.

Figure 3:
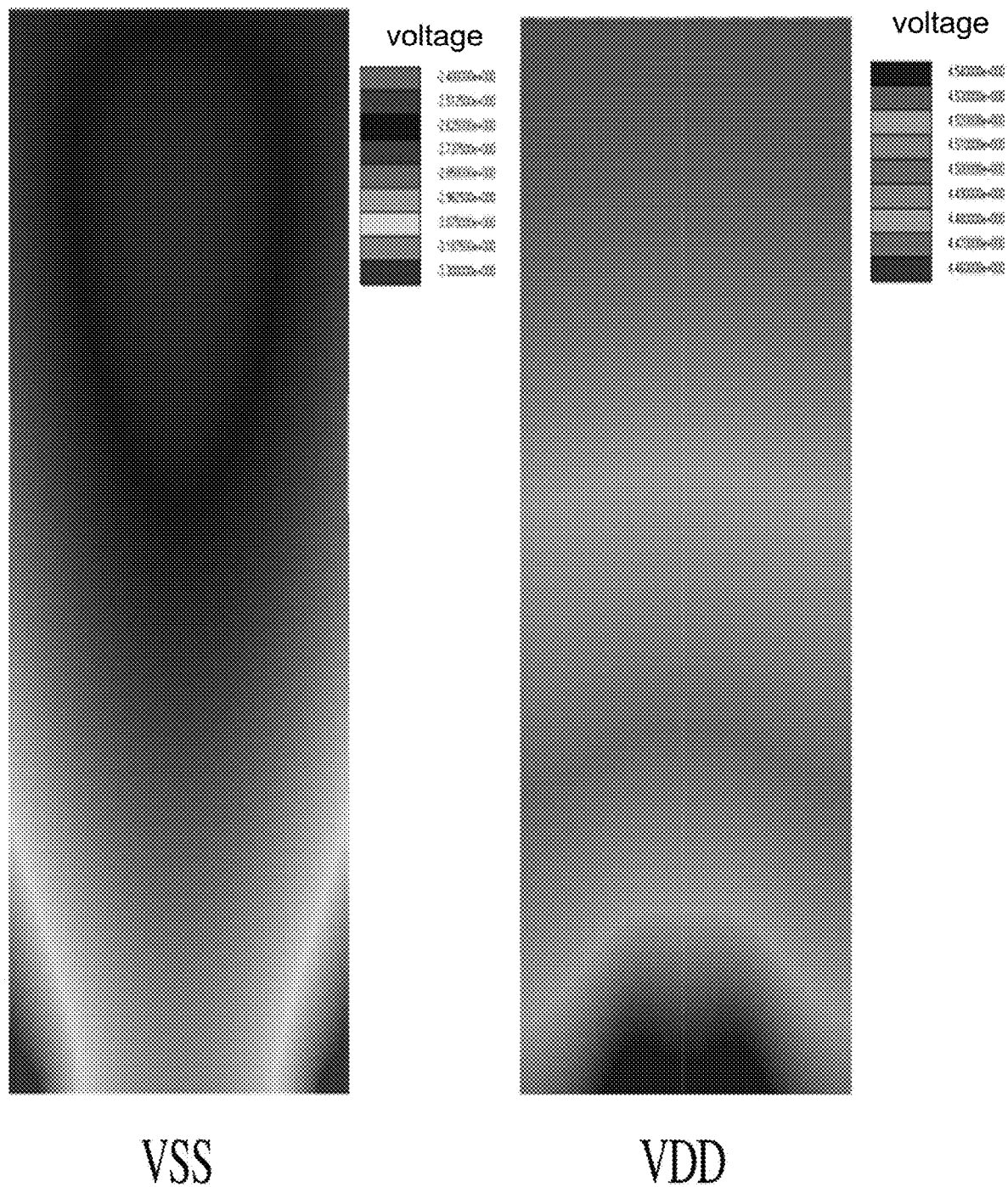
FIG. 3 is a voltage distribution simulation test result using a power line wiring structure of the disclosure.

Referring to FIG. 3, a schematic view of a voltage distribution simulation test result of the first power line 22 and the second power line 23 (i.e., VDD and VSS) of the display area 10 (i.e., an AA area) by using the power line wiring structure of the disclosure and a 6.2 inch (WQHD) panel to proceed a voltage drop (IR drop) is shown. It can be seen from the simulation result that the highest voltage of VDD is mainly distributed in the middle of the lower part of the AA area, and the lowest voltage of VSS is distributed on the left and right sides of the lower part of the AA area. This can avoid excessive brightness at the highest brightness point caused by excessive voltage difference between VDD and VSS. The brightness uniformity can reach 84%. That indicates that the power line wiring structure can significantly improve the brightness uniformity.

The disclosure provides a power line wiring structure. A position for a first power line entering into a display area (i.e., the AA area) is separated from a position for a second power line (i.e., VDD and VSS) entering into a display area. An appropriate spacing is disposed to avoid excessive VDD and VSS voltage differences. Brightness uniformity of a display panel is improved. At the same time, it can prevent the VDD voltage from being too concentrated on the lower side of the AA region, resulting in excessive current of a driver thin film transistor (Driver TFT). In addition, a wiring arrangement and a line width of the power line are optimized to reduce voltage drop and reduce power consumption.

This disclosure has been described with preferred embodiments thereof, and it is understood that many changes and modifications to the described embodiment can be carried out without departing from the scope and the spirit of the invention. Rather, modifications and equivalent arrangements are intended to be included within the scope of the disclosure.

What is claimed is:

1. A power line wiring structure for a flexible display panel, comprising: the flexible display panel comprises a display area and a non-display area, a first and a second power lines formed in the non-display area and disposed surround the display area, the non-display area comprises a bending area disposed at a first side of the display area; the first power line comprising a first lateral section, a first connection section, and a second lateral section in parallel with the first lateral section, wherein the first lateral section is connected to the second lateral section through the first connection section, and the first connection section comprises at least two parallel first sub-connection lines; and the second power line comprising a retracted section and a second connection section located on each of two corners of both ends of the first side, and a peripheral section disposed around all other sides of the display area and the two corners of the display, wherein the retracted section is connected to the peripheral section through the second connection section along both ends of the bending area, the second connection section comprises at least two second sub-connection lines, and the at least two second sub-connection lines are in parallel with and disposed outside the at least two first sub-connection lines respectively; and wherein the first lateral section is disposed between the display area and a first side of the bending area; and the retracted sections and the second lateral section disposed at a second side of the bending area opposite to the first side; and wherein a width of the second sub-connection line is less than a width of the first sub-connection line, and a distance between any one of the second sub-connection lines and any one of the first sub-connection lines is greater than the distance of any two the first sub-connection lines; a distance between a center line of the first sub-connection line and a second side of the display area is in a range of 20 mm to 30 mm, and wherein the second side and the first side are adjacent to each other.

* * * * *